(12) United States Patent
Griffin

(10) Patent No.: US 8,884,798 B2
(45) Date of Patent: Nov. 11, 2014

(54) BINARY DIVARICATION DIGITAL-TO-ANALOG CONVERSION

(71) Applicant: Atmel Corporation, San Jose, CA (US)

(72) Inventor: Jed Griffin, Peyton, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/690,835

(22) Filed: Nov. 30, 2012

(65) Prior Publication Data

US 2014/0062746 A1 Mar. 6, 2014

Related U.S. Application Data

(60) Provisional application No. 61/697,183, filed on Sep. 5, 2012.

(51) Int. Cl.
*H03M 1/66* (2006.01)
*H03M 1/72* (2006.01)

(52) U.S. Cl.
CPC . *H03M 1/66* (2013.01); *H03M 1/72* (2013.01)
USPC ............................ 341/144; 341/145; 341/154

(58) Field of Classification Search
CPC ....... H03M 1/66; H03M 1/742; H03M 1/765; H03M 1/70; H03M 1/785; H03M 2201/3168; H03M 1/46; H03M 1/0612; H03M 1/167; H03M 1/72
USPC .......................................... 341/144, 154, 145
See application file for complete search history.

(56) References Cited

U.S. PATENT DOCUMENTS

| | | | | |
|---|---|---|---|---|
| 5,495,245 A | * | 2/1996 | Ashe | 341/145 |
| 6,384,762 B2 | * | 5/2002 | Brunolli et al. | 341/144 |
| 6,414,616 B1 | * | 7/2002 | Dempsey | 341/144 |
| 6,914,547 B1 | * | 7/2005 | Swaroop et al. | 341/144 |
| 7,136,002 B2 | * | 11/2006 | Dempsey et al. | 341/145 |
| 7,375,669 B2 | * | 5/2008 | Kim et al. | 341/145 |
| 7,420,496 B2 | * | 9/2008 | Kim et al. | 341/145 |
| 7,639,166 B2 | * | 12/2009 | Iijima | 341/145 |
| 8,188,899 B2 | * | 5/2012 | Motamed | 341/145 |
| 8,228,223 B2 | * | 7/2012 | Hirai | 341/159 |
| 8,248,286 B2 | * | 8/2012 | Neagoe et al. | 341/144 |

* cited by examiner

*Primary Examiner* — Linh Nguyen
(74) *Attorney, Agent, or Firm* — Fish & Richardson P.C.

(57) ABSTRACT

Systems and techniques for performing binary divarication digital-to-analog conversion are described. A described converter includes voltage range adjusters arranged in series to convert a digital sequence to an analog representation, each of the adjusters being responsive to a respective bit of the digital sequence, and a combiner. The first adjuster produces first high and low output voltages based on first high and low input voltages and a most significant bit value of the digital sequence. The last adjuster produces last high and low output voltages based on last high and low input voltages and a least significant bit value of the digital sequence. The last high and low input voltages are responsive to the first high and low output voltages as modified by any of zero or more intermediate voltage range adjusters. The combiner produces an analog output signal based on the last high and low output voltages.

20 Claims, 5 Drawing Sheets

US 8,884,798 B2

BINARY DIVARICATION DIGITAL-TO-ANALOG CONVERSION

CROSS REFERENCE TO RELATED APPLICATION

This patent document claims the benefit of the priority of U.S. Provisional Application Ser. No. 61/697,183, filed Sep. 5, 2012 and entitled "BINARY DIVARICATION DIGITAL-TO-ANALOG CONVERSION." The disclosure of this above-identified document is incorporated herein by reference in its entirety.

TECHNICAL FIELD

This patent document relates generally to digital-to-analog conversion.

BACKGROUND

Digital systems can use digital-to-analog converters (DAC) to convert digital signals into analog signals. Examples of DACs include oversampling/interpolating DAC such as a delta-sigma DAC and a binary-weighted DAC such as a R-2R ladder DAC. The resolution of a DAC refers to the number of potential output levels. A n-bit DAC has a resolution of $2^n$ levels.

SUMMARY

This document describes, among other things, technologies relating to a binary divarication DAC (BD-DAC). In one aspect, a described converter includes voltage range adjusters arranged in series to convert a digital sequence to an analog representation, each of the voltage range adjusters being responsive to a respective bit of the digital sequence, the voltage range adjusters including a first voltage range adjuster, zero or more intermediate voltage range adjusters, and a last voltage range adjuster. The first voltage range adjuster can produce first high and low output voltages based on first high and low input voltages and a most significant bit value of the digital sequence. The last voltage range adjuster can produce last high and low output voltages based on last high and low input voltages and a least significant bit value of the digital sequence. The last high and low input voltages are responsive to the first high and low output voltages as modified by any of the zero or more intermediate voltage range adjusters, The converter can include a combiner that produces an analog output signal based on the last high and low output voltages.

This and other implementations can include one or more of the following features. The first high and low input voltages can define a first range. The first high and low output voltages can define a second, smaller range. The first voltage range adjuster can be configured to select, based on the most significant bit value, the second range to be either an upper half of the first range or a lower half of the first range. In some implementations, each of the voltage range adjusters can include a bit input, a first switch, and a second switch, The first switch can be responsive to the bit input. The second switch can be responsive to a negated version of the bit input. The digital sequence can include N bits, where a quantity of the voltage range adjusters is equal to N. The zero or more intermediate voltage range adjusters can include one or more intermediate voltage range adjusters that are coupled between the first voltage range adjuster and the last voltage range adjuster. In some implementations, the first high input voltage is a predetermined voltage greater than zero, and the first low input voltage is ground. In some implementations, the first high input voltage is a predetermined voltage greater than zero, and the first low input voltage is a negative version of the predetermined voltage.

In another aspect, a described system includes a processor configured to produce one or more digital sequences and a binary divarication digital-to-analog converter configured to convert the one or more digital sequences to an analog output signal. The converter can include voltage range adjusters arranged in series to convert a digital sequence of the one or more digital sequences to an analog representation, each of the voltage range adjusters being responsive to a respective bit of the digital sequence, the voltage range adjusters comprising a first voltage range adjuster, zero or more intermediate voltage range adjusters, and a last voltage range adjuster, where the first voltage range adjuster produces first high and low output voltages based on first high and low input voltages and a most significant bit value of the digital sequence, where the last voltage range adjuster produces last high and low output voltages based on last high and low input voltages and a least significant bit value of the digital sequence, and where the last high and low input voltages are responsive to the first high and low output voltages as modified by any of the zero or more intermediate voltage range adjusters. The converter can include a combiner that produces the analog output signal based on the last high and low output voltages. In some implementations, the processor and the converter are formed on a single integrated circuit. In some implementations, the processor and the converter are formed on separate integrated circuits.

In another aspect, a described technique includes providing a digital sequence to voltage range adjusters arranged in series to convert the digital sequence to an analog output signal, each of the voltage range adjusters being responsive to a respective bit of the digital sequence, the voltage range adjusters including a first voltage range adjuster, zero or more intermediate voltage range adjusters, and a last voltage range adjuster; operating each of the voltage range adjusters to produce high and low output voltages based on high and low input voltages and a bit value of the digital sequence; and combining the high and low output voltages of the last voltage range adjuster to produce the analog output signal.

These and other implementations can include one or more of the following features. Implementations can include providing static high and low voltages as the high and low input voltages of the first voltage range adjuster, where the static high and low voltages define a first range, where the high and low output voltages of the first voltage range adjuster define a second, smaller range. Implementations can include operating the first voltage range adjuster to select, based on the most significant bit value, the second range to be either an upper half of the first range or a lower half of the first range.

Particular embodiments of the technology described in this document can be implemented so as to realize one or more of the following advantages. A described technology can minimize or eliminate a differential non-linearity (DNL) between a DAC's input and output. A BD-DAC can occupy a smaller area of a die than conventional DACs such as a R-2R ladder DAC for the same resolution.

The details of one or more embodiments of the subject matter described in this document are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
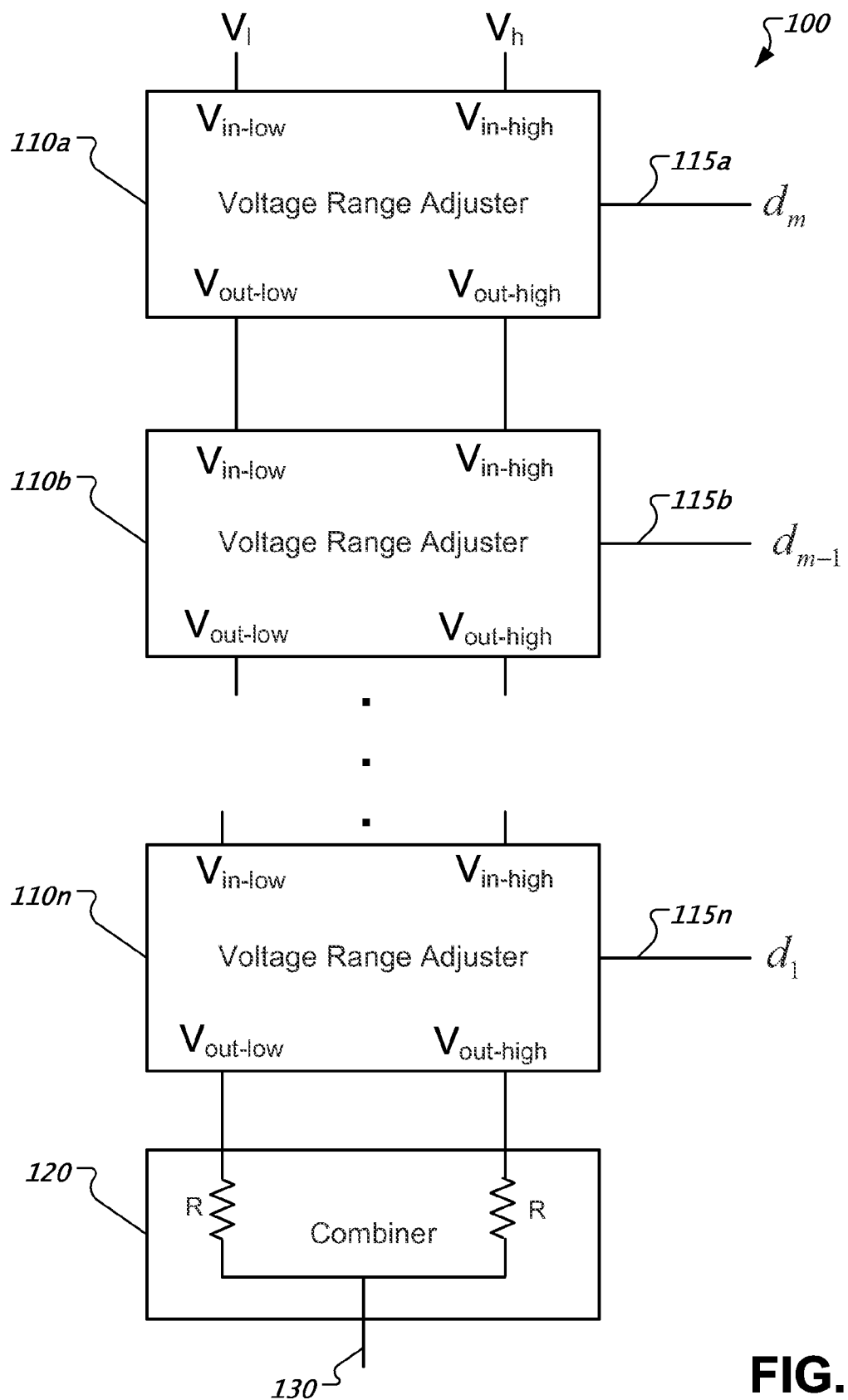
FIG. 1 shows a schematic diagram of an example architecture of a BD-DAC.

FIG. 1 shows a schematic diagram of an example architecture of a BD-DAC 100. The converter 100 includes multiple voltage range adjusters 110a-n and a combiner 120. The voltage range adjusters 110a-n are arranged in series to convert, a digital sequence to an analog representation. The digital sequence includes bits $d_1$ to $d_m$, where $d_m$ represents the most significant bit. The bits 115a-n of the digital sequence are input into the voltage range adjuster 110a-n, respectively. The most significant bit of the digital sequence is input into the first voltage range adjuster 115a. The second most significant bit of the digital sequence is input into the second voltage range adjuster 115b. Finally, the least significant bit of the sequence is input into the last voltage range adjuster 115n.

The converter 100 outputs analog signals in a voltage range defined by a first voltage $V_1$ and a second voltage $V_h$, where the first voltage $V_1$ represents the lowest possible voltage, and second voltage $V_h$ represents the highest possible voltage. In some implementations, the first voltage $V_1$ is ground and the second voltage $V_h$ is a predetermined voltage that is greater than ground. The voltages $V_1$ and $V_h$ are input into the first voltage range adjuster 115a as $V_{in-low}$ and $V_{in-high}$, respectively. The network of voltage range adjusters 110a-n successively outputs narrower ranges based on the bits 115a-n of the digital sequence. Each voltage range adjuster 110a-n selects, based on its respective bit 115a-n, the higher or the lower half of an input range defined from $V_{in-low}$ to $V_{in-high}$. The output signals $V_{out-low}$ and $V_{out-high}$ define the new, smaller range.

In this example, the first voltage range adjuster 115a produces $V_{out-low}$ and $V_{out-high}$ voltages based on the $V_{in-low}$ and $V_{in-high}$ voltages and the value of the $d_m$ bit. The $V_{out-low}$ and $V_{out-high}$ voltages are input into the second voltage range adjuster 115a as $V_{in-low}$ and $V_{in-high}$, respectively. As depicted, the low and high output voltages of a voltage range adjuster become the low and high input voltages for the next voltage range adjuster in the series. The low and high output voltages of the last voltage range adjuster 115n are input into a combiner 120 that sums these voltages via two resisters that each have a fundamental resistant of R. The value of R can be selected based on design and/or performance considerations. The output of the combiner 120 is an analog voltage signal 130, which is the analog equivalent of the digital sequence.

Figure 2:
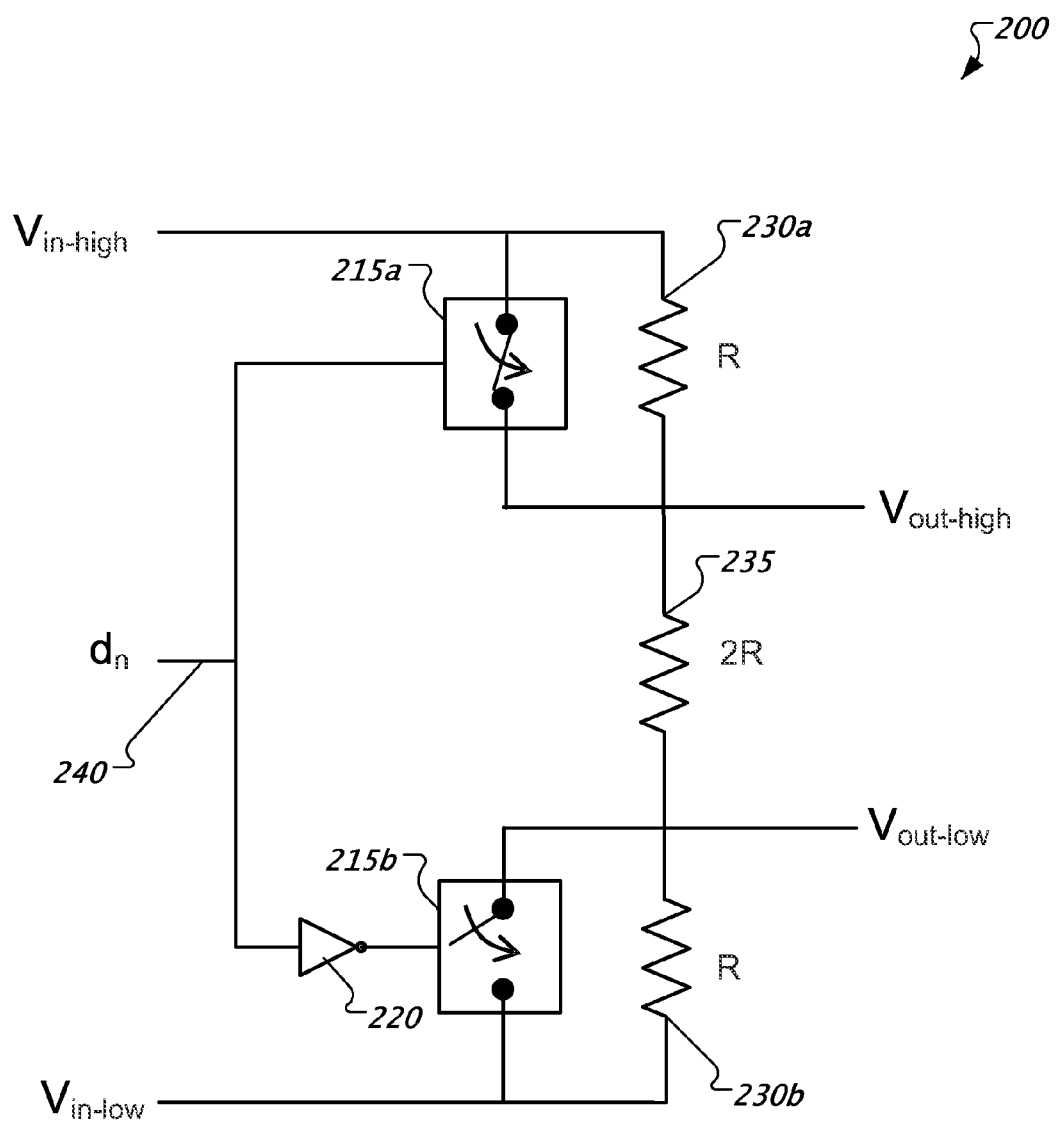
FIG. 2 shows a schematic diagram of an example architecture of a voltage range adjuster of a BD-DAC.

FIG. 2 shows a schematic diagram of an example architecture of a voltage range adjuster 200 of a BD-DAC. Two or more voltage ranger adjusters 200 can be arranged in series based on the BD-DAC architecture depicted by FIG. 1. A voltage range adjuster 200 includes two switches 215a-b, an inverter 220, resistors 230a-b, and resistor 235. A bit 240 of a digital sequence is input into the voltage range adjuster 200. The bit 240 is distributed to a first switch 215a and a negated version of the bit 240 is distributed to a second switch 215b. The inverter 220 performs the negation of the bit 240. Thus, the second switch 215b is in an opposite state of the first switch 215a.

The first switch 215a is associated with a $V_{in-high}$ input voltage, a first resistor 230a, and a $V_{out-high}$ output voltage. The second switch 215b is associated with a $V_{in-low}$ input voltage, a second resistor 230b, and a $V_{out-low}$ output voltage. If a switch 215a-b is on, then it effectively shorts-out, or bypasses its associated resistor 230a-b. The first and second resistors 230a-b each have a fundamental resistant of R. The value of R can be selected based on design and/or performance considerations. Another resistor 235, having a resistant of 2R is situated between the first and second resistors 230a-b.

If the bit 240 to the voltage range adjuster 200 is one, then it causes the first switch 215a to be on and the second switch 215 to be off. In this scenario, the $V_{out-high}$ output voltage equals the $V_{in-high}$ input voltage and the $V_{out-low}$ output voltage is a voltage halfway between the $V_{in-low}$ input voltage and the $V_{in-high}$ input voltage. If the bit 240 to the voltage range adjuster 200 is zero, then it causes the first switch 215a to be off and the second switch 215 to be on. In this scenario, the $V_{out-low}$ output voltage equals the $V_{in-low}$ input voltage and the $V_{out-high}$ output voltage is a voltage halfway between the $V_{in-low}$ input voltage and the $V_{in-high}$ input voltage.

A resistor network created by arranging two or more voltage range adjusters 200 in accordance with the BD-AC architecture of FIG. 1 works in that the 2R resistance at the output of a voltage range adjuster is feeding into a 2R resistance for the next voltage range adjuster, hence becoming R in series with the selected R in the immediate instance, whichever bit it may be. Each voltage range adjuster 200 creates a smaller voltage range by switching to either the upper half or lower half of its input voltage range based on its respective digital input for that bit across two resistors of equal value R in series, passing the smaller range on to the next voltage range adjuster.

Figure 3:
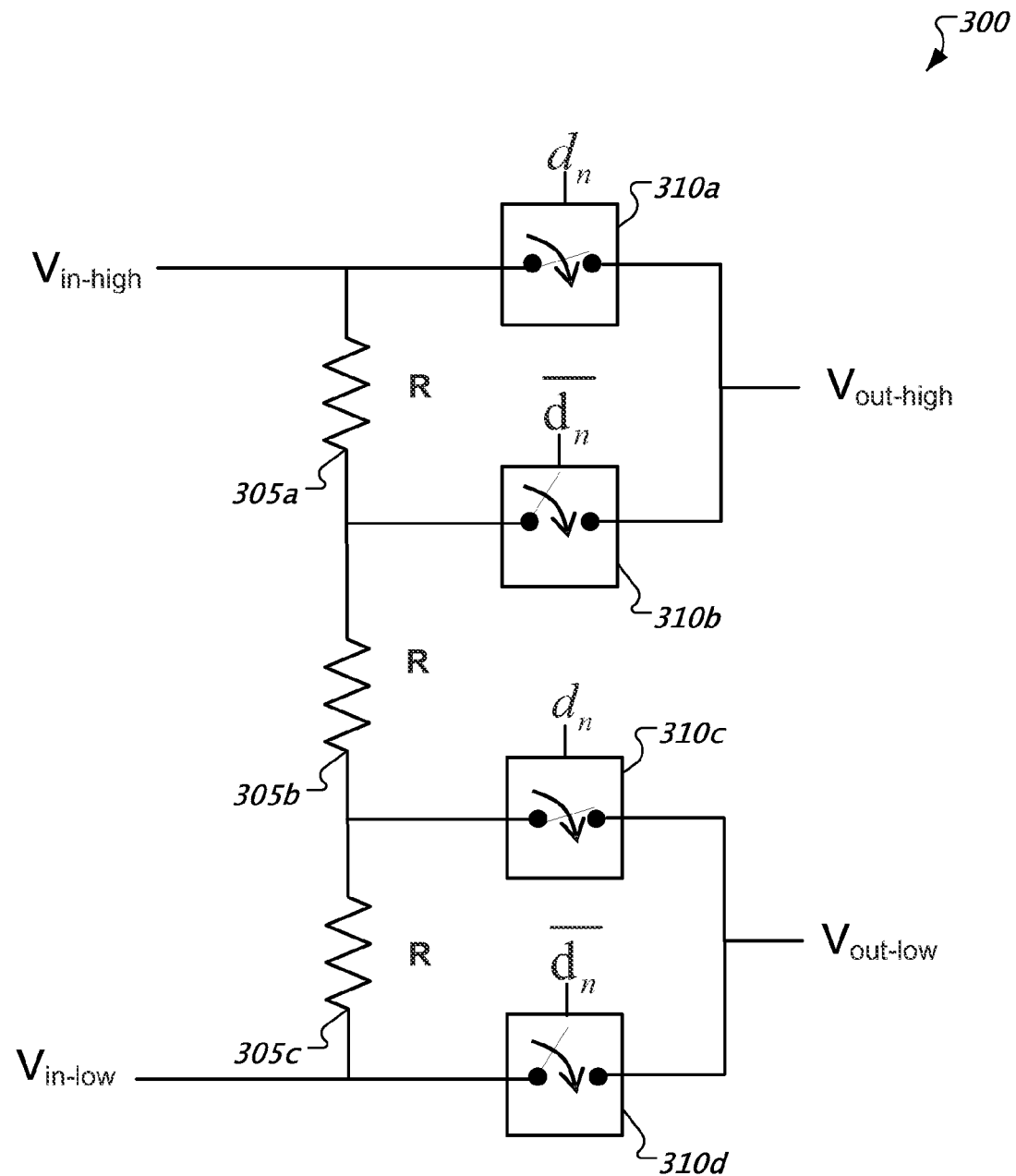
FIG. 3 shows a schematic diagram of another example architecture of a voltage range adjuster of a BD-DAC.

FIG. 3 shows a schematic diagram of another example architecture of a voltage range adjuster 300 of a BD-DAC. Two or more voltage ranger adjusters 300 can be arranged in series based on the BD-DAC architecture depicted by FIG. 1. The voltage range adjuster 300 of FIG. 3 is functionally equivalent to the voltage range adjuster 200 of FIG. 2, however their internal architectures are different. The voltage range adjuster 300 includes resistors 305a-c and switches 310a-d. Switches 310a and 310b are associated with the $V_{in-high}$ input voltage and the $V_{out-low}$ output voltage. These switches 310a and 310b operate based on a value of a bit (labeled as $d_n$) and a negated value of the bit, respectively. Whereas, switches 310c and 310d are associated with the $V_{in-low}$ input voltage and $V_{out-low}$ output voltage. These switches 310c and 310d operate based on the value of the bit (labeled as $d_n$) and a negated value of the bit, respectively.

Figure 4:
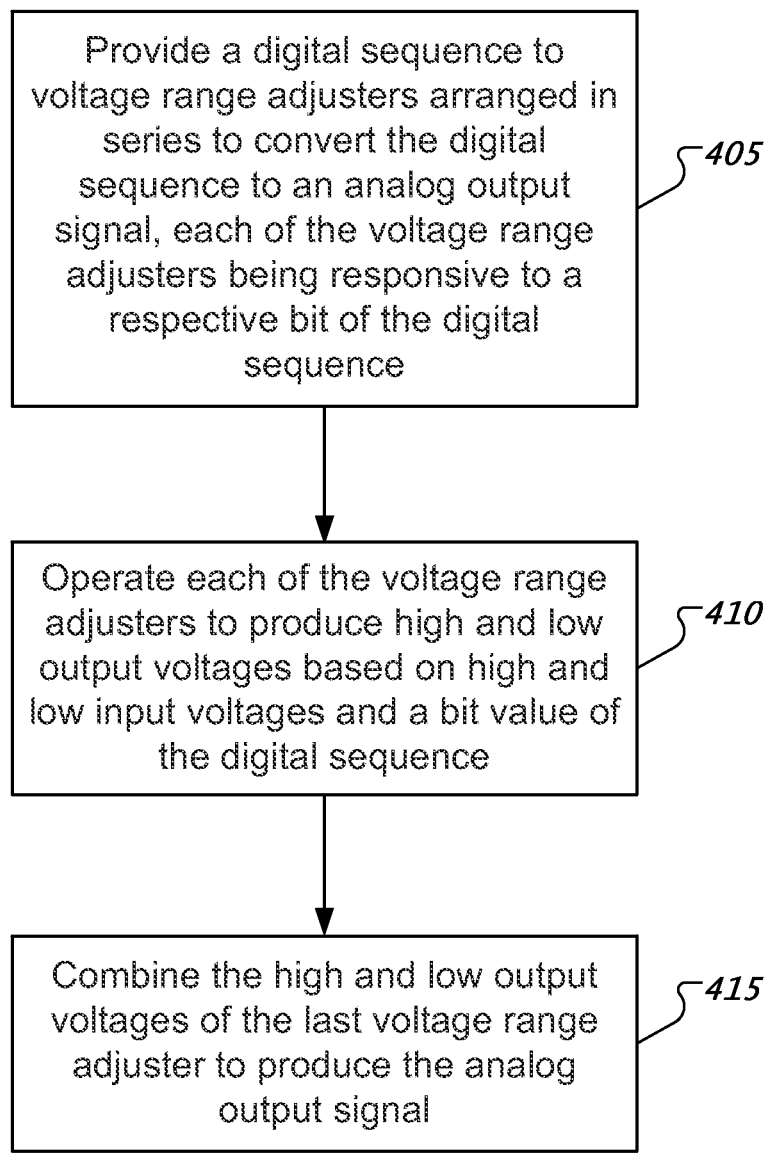
FIG. 4 shows a flowchart of an example process that includes operating a BD-DAC.

FIG. 4 shows a flowchart of an example process that includes operating a BD-DAC. At 405, the process provides a digital sequence to voltage range adjusters arranged in series to convert the digital sequence to an analog output signal, each of the voltage range adjusters being responsive to a respective bit of the digital sequence. The voltage range adjusters can include a first voltage range adjuster, zero or more intermediate voltage range adjusters, and a last voltage range adjuster. At 410, the process operates each of the voltage range adjusters to produce high and low output voltages based on high and low input voltages and a bit value of the digital sequence. The process can include providing static high and low voltages as the high and low input voltages of the first voltage range adjuster. The static high and low voltages can define a first range. The high and low output voltages of the first voltage range adjuster can define a second, smaller range. The process can include operating the first voltage range adjuster to select, based on the most significant bit value, the second range to be either an upper half of the first range or a lower half of the first range. At 415, the process combines the high and low output voltages of the last voltage range adjuster to produce the analog output signal.

Figure 5:
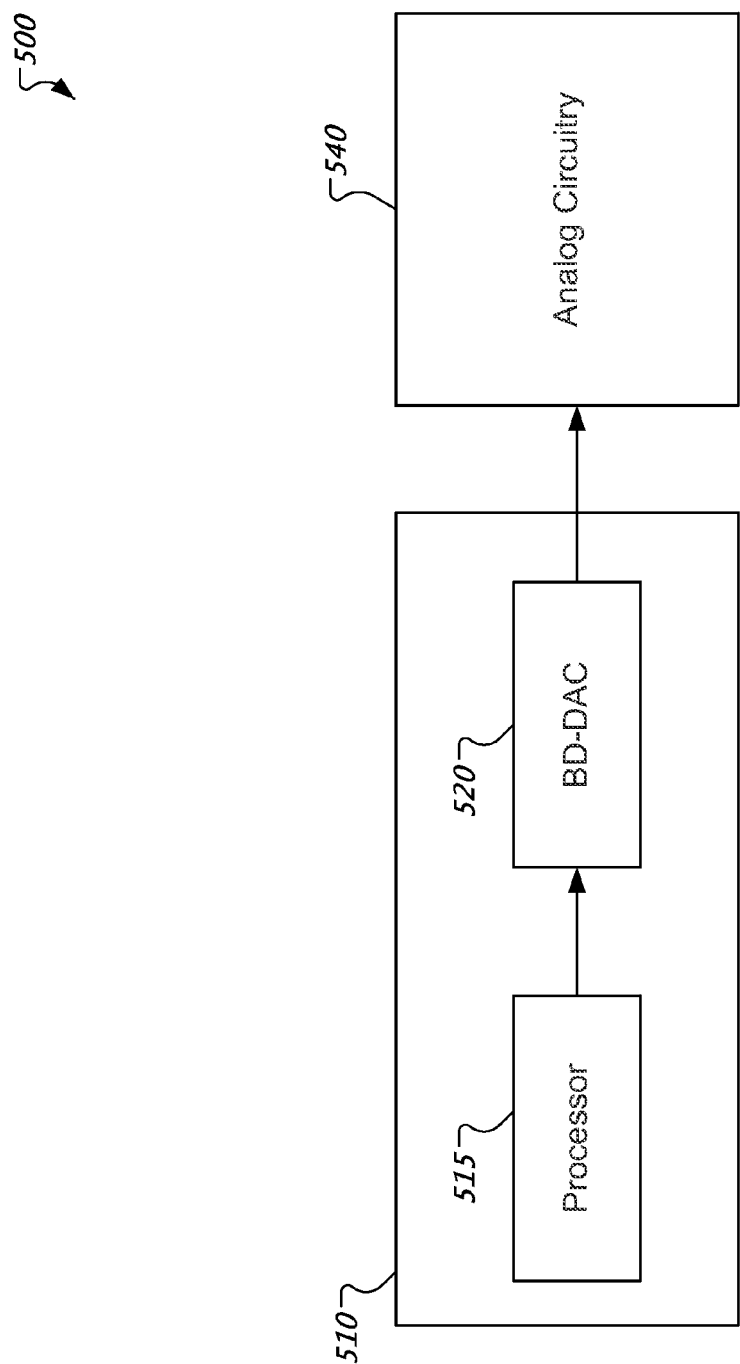
FIG. 5 shows a schematic diagram of a system that includes an integrated circuit.

FIG. 5 shows a schematic diagram of a system 500 that includes an integrated circuit 510. The integrated circuit 510 includes a processor 515 and a BD-DAC 520. The processor can provide a digital sequence to the BD-DAC 520. The BD-DAC 520 converts the digital sequence into an analog output signal, which is input to analog circuitry 540. BD-DAC 520 is suitable for use in a wide-range of applications. In some implementations, the analog circuitry 540 includes a modulator to modulate the incoming analog output signal to produce a wireless transmission signal. In some implementations, the analog circuitry 540 includes an amplifier to amplify the incoming analog output signal before output on a speaker. The integrated circuit 510 can be manufactured by using a complementary metal-oxide-semiconductor (CMOS) process. Other types of processes are possible.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. An apparatus comprising:
   a plurality of voltage range adjusters, one for each bit of a digital sequence, arranged in series such that the plurality of voltage range adjusters is configured to convert the digital sequence to an analog representation, each of the voltage range adjusters being configured to receive a respective bit of the digital sequence, the voltage range adjusters comprising a first voltage range adjuster, zero or more intermediate voltage range adjusters, and a last voltage range adjuster,
   wherein the first voltage range adjuster is configured to produce first high and low output voltages based on first high and low input voltages, respectively, and a most significant bit value of the digital sequence,
   wherein the last voltage range adjuster is configured to produce last high and low output voltages based on last high and low input voltages, respectively, and a least significant bit value of the digital sequence,
   wherein the last high and low input voltages are responsive to the first high and low output voltages, respectively, as modified by any of the zero or more intermediate voltage range adjusters; and
   a combiner configured to produce an analog output signal based on the last high and low output voltages.

2. The apparatus of claim 1, wherein the first high and low input voltages define a first range, wherein the first high and low output voltages define a second, smaller range, and wherein the first voltage range adjuster is configured to select, based on the most significant bit value, the second range to be either an upper half of the first range or a lower half of the first range.

3. The apparatus of claim 1, wherein each of the voltage range adjusters comprises a bit input, a first switch, and a second switch, wherein the first switch is responsive to the bit input, and wherein the second switch is responsive to a negated version of the bit input.

4. The apparatus of claim 1, wherein the digital sequence comprises N bits, wherein a quantity of the voltage range adjusters is equal to N, and wherein the zero or more intermediate voltage range adjusters comprise one or more intermediate voltage range adjusters that are coupled between the first voltage range adjuster and the last voltage range adjuster.

5. The apparatus of claim 1, wherein the first high input voltage is a predetermined voltage greater than zero, and wherein the first low input voltage is ground.

6. The apparatus of claim 1, wherein the first high input voltage is a predetermined voltage greater than zero, and wherein the first low input voltage is a negative version of the predetermined voltage.

7. A system comprising:
   a processor configured to produce one or more digital sequences; and
   a binary divarication digital-to-analog converter configured to convert the one or more digital sequences to an analog output signal, wherein the converter comprises:
   a plurality of voltage range adjusters, one for each bit of a digital sequence of the one or more digital sequences, arranged in series and configured to convert the digital sequence of the one or more digital sequences to an analog representation, each of the voltage range adjusters being configured to receive a respective bit of the digital sequence, the voltage range adjusters comprising a first voltage range adjuster, zero or more intermediate voltage range adjusters, and a last voltage range adjuster, wherein the first voltage range adjuster is configured to produce first high and low output voltages based on first high and low input voltages, respectively, and a most significant bit value of the digital sequence, wherein the last voltage range adjuster is configured to produce last high and low output voltages based on last high and low input voltages, respectively, and a least significant bit value of the digital sequence, wherein the last high and low input voltages are responsive to the first high and low output voltages, respectively, as modified by any of the zero or more intermediate voltage range adjusters, and
   a combiner that is configured to produce the analog output signal based on the last high and low output voltages.

8. The system of claim 7, wherein the first high and low input voltages define a first range, wherein the first high and low output voltages define a second, smaller range, and wherein the first voltage range adjuster is configured to select, based on the most significant bit value, the second range to be either an upper half of the first range or a lower half of the first range.

9. The system of claim 7, wherein each of the voltage range adjusters comprises a bit input, a first switch, and a second switch, wherein the first switch is responsive to the bit input, and wherein the second switch is responsive to a negated version of the bit input.

10. The system of claim 7, wherein the digital sequence comprises N bits, wherein a quantity of the voltage range adjusters is equal to N, and wherein the zero or more intermediate voltage range adjusters comprise one or more intermediate voltage range adjusters that are coupled between the first voltage range adjuster and the last voltage range adjuster.

11. The system of claim 7, wherein the first high input voltage is a predetermined voltage greater than zero, and wherein the first low input voltage is ground.

12. The system of claim 7, wherein the first high input voltage is a predetermined voltage greater than zero, and wherein the first low input voltage is a negative version of the predetermined voltage.

13. The system of claim 7, wherein the processor and the converter are formed on a single integrated circuit.

14. The system of claim 7, wherein the processor and the converter are formed on separate integrated circuits.

15. A method comprising:
providing a digital sequence to a plurality of voltage range adjusters, including one voltage range adjuster for each bit of the digital sequence, and arranged in series to convert the digital sequence to an analog output signal, each of the voltage range adjusters being configured to receive a respective bit of the digital sequence, the voltage range adjusters comprising a first voltage range adjuster, zero or more intermediate voltage range adjusters, and a last voltage range adjuster;
operating each of the voltage range adjusters to produce high and low output voltages based on high and low input voltages, respectively, and a bit value of the digital sequence; and
combining the high and low output voltages of the last voltage range adjuster to produce the analog output signal.

16. The method of claim 15, further comprising:
providing static high and low voltages as the high and low input voltages of the first voltage range adjuster, wherein the static high and low voltages define a first range, wherein the high and low output voltages of the first voltage range adjuster define a second, smaller range; and
operating the first voltage range adjuster to select, based on the most significant bit value, the second range to be either an upper half of the first range or a lower half of the first range.

17. The method of claim 16, wherein the static high voltage is a predetermined voltage greater than zero, and wherein the static low voltage is ground.

18. The method of claim 16, wherein the static high voltage is a predetermined voltage greater than zero, and wherein the static low voltage is a negative version of the predetermined voltage.

19. The method of claim 15, wherein each of the voltage range adjusters comprises a bit input, a first switch, and a second switch, wherein the first switch is responsive to the bit input, and wherein the second switch is responsive to a negated version of the bit input.

20. The method of claim 15, wherein the digital sequence comprises N bits, wherein a quantity of the voltage range adjusters is equal to N, and wherein the zero or more intermediate voltage range adjusters comprise one or more intermediate voltage range adjusters that are coupled between the first voltage range adjuster and the last voltage range adjuster.

* * * * *

UNITED STATES PATENT AND TRADEMARK OFFICE
CERTIFICATE OF CORRECTION

PATENT NO. : 8,884,798 B2  
APPLICATION NO. : 13/690835  
DATED : November 11, 2014  
INVENTOR(S) : Jed Griffin Page 1 of 1

It is certified that error appears in the above-identified patent and that said Letters Patent is hereby corrected as shown below:

In The Specification

Column 1 Line 59 Delete "switch," and insert --switch.--, therefor.

Column 3 Line 17-18 (Approx) delete "convert," and insert --convert--, therefor.

Column 4 Line 16 delete "halfway" and insert --half way--, therefor.

Column 4 Line 21 delete "halfway" and insert --half way--, therefor.

Signed and Sealed this  
Twenty-eighth Day of April, 2015

Michelle K. Lee  
*Director of the United States Patent and Trademark Office*